United States Patent [19]

Vick

[11] Patent Number: 4,913,548
[45] Date of Patent: Apr. 3, 1990

[54] SOLID STATE FIBER OPTIC SEMICONDUCTOR RING LASER GYRO APPARATUS WITH NON-OPTICAL READOUT

[75] Inventor: Gerald L. Vick, Mt. Vernon, Iowa

[73] Assignee: Rockwell International Corporation, El Segundo, Calif.

[21] Appl. No.: 247,986

[22] Filed: Sep. 21, 1988

[51] Int. Cl.[4] .............................................. G01C 19/64
[52] U.S. Cl. ..................................... 356/350; 372/46; 372/94
[58] Field of Search ................... 356/350; 372/46, 50, 372/108, 104, 38; 350/96.13, 96.14

[56] References Cited

U.S. PATENT DOCUMENTS

| | | | |
|---|---|---|---|
| 3,427,563 | 2/1969 | Lasher | 372/50 |
| 4,405,236 | 8/1983 | Mitsuhashi et al. | 372/94 |
| 4,431,308 | 2/1984 | Mitsuhashi et al. | 356/350 |
| 4,794,346 | 12/1988 | Miller | 372/50 |

Primary Examiner—Vincent P. McGraw
Assistant Examiner—S. A. Turner
Attorney, Agent, or Firm—Gregory G. Williams; M. Lee Murrah; H. Frederick Hamann

[57] ABSTRACT

A solid state fiber optical semiconductor ring laser gyro apparatus with nonoptical readout which contains an optical fiber optically coupled with a optical amplifier diode which has a ground electrode and a plurality of non ground electrodes, which are both electrically and spacially separated and disposed across the optically active channel of the optical amplifier diode, the magnitude and direction of rotation of the optical fiber ring can be determined by examining the differences in phase information between the outputs on the plurality of non ground electrodes.

4 Claims, 1 Drawing Sheet

SOLID STATE FIBER OPTIC SEMICONDUCTOR RING LASER GYRO APPARATUS WITH NON-OPTICAL READOUT

FIELD OF THE INVENTION

The present invention generally relates to ring laser gyroscopes, and more particularly, relates to fiber optic ring laser gyros, and even more particularly, is concerned with solid state semiconductor fiber optic ring laser gyroscopes with non-optical readouts.

BACKGROUND OF THE INVENTION

One particular area in which avionics engineers have expended much effort and achieved many successes, is in the substitution of completely electro-optical systems for the conventional mechanical systems of the past. A prime example of these efforts is in the area of inertial navigation systems.

Mechanical gyroscopes have been, for years, a central component to many inertial navigation systems. Recently, the helium neon (He-Ne) laser gyroscope has replaced many of the mechanical gyros. However, these He-Ne ring laser gyros have disadvantages in cost and size, among others. With the recent advent of the global positioning system, which uses satellite communications to assist inertial navigation systems, the fiber optic ring laser gyroscopes are becoming more attractive.

Fiber optic ring laser gyros typically have as one of their components, an optical readout device for analyzing the frequency of light signals that are split off from the ring. Often this is done with a fiber optic directional coupler, which is connected to an optical detector by two optical fibers.

While these optical detectors have been used extensively in the past, they do have several serious drawbacks. The inclusion of the optical detectors increase the relative size, weight, part count and cost of the overall system.

Another approach to detect the rotation of a ring laser has been attempted and it is described in U.S. Pat. No. 4,431,308 entitled "Laser Angular Speed Detector Employing Non-Optical Output," which was issued to Mitsuhashi et al., on Feb. 14, 1984, which patent is incorporated herein by this reference. That design uses a laser element to detect a beat signal of the difference in frequency between a clockwise beam and a counter-clockwise beam within the fiber optic ring. However, that design does not provide information on the direction of the rotation.

Consequently, a need exists for the improvement in solid state semiconductor fiber optic ring laser gyroscopes, which reduce the relative size, and weight of the gyroscopes while still providing both magnitude and direction information.

OBJECTS OF THE INVENTION

It is an object of the present invention to provide a fiber optic resonant ring laser gyroscope with reduced relative size and weight.

It is a feature of the present invention to include an optical amplifier diode for detecting ring rotation.

It is an advantage of the present invention to eliminate the need for an optical detector attached to a fiber optic directional coupler.

It is another object of the present invention to improve the information that can be determined by gyros with non-optical readouts.

It is another feature of the present invention to include an optical amplifier diode which has at least two non-ground electrodes which are split across the length of the optically active channel of the diode.

It is another advantage of the present invention to allow for the detection of both the magnitude and direction of the rotation of the ring laser, by comparing the signal phase information from the two electrodes.

SUMMARY OF THE INVENTION

The present invention provides a solid state fiber optic semiconductor ring laser gyroscope that is designed to fulfill the aforementioned needs, satisfy the earlier propounded objects, include the above described features, and achieve the previously stated advantages. The invention is carried out in an "optical detector-less" approach, in the sense that the gyroscope does not contain the typical optical detector device which is coupled with the resonant ring through a fiber optic directional coupler and two optical fibers. Instead, the rotation detection is achieved by using an optical amplifier diode with two non-ground electrodes split over the optically active channel of the diode.

Accordingly, the present invention includes a solid state semiconductor fiber optic ring laser gyroscope which utilizes an optical amplifier diode having at least two non-ground electrodes split across the optically active channel of the diode for determining the direction of rotation of the ring by obtaining phase information relating to the counter propagating beams within the resonant ring.

BRIEF DESCRIPTION OF THE DRAWINGS

The invention may be more fully understood by reading the following description of a preferred embodiment of the invention in conjunction with the appended drawings wherein.

DETAILED DESCRIPTION

Figure 1:
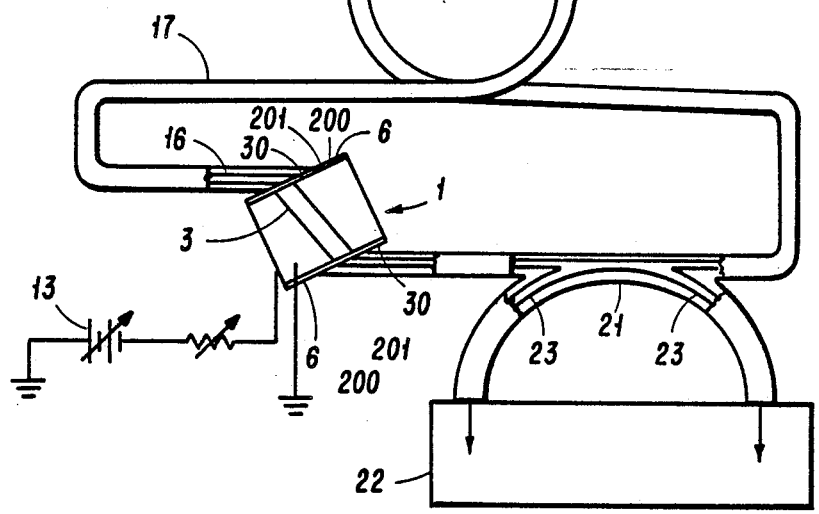
FIG. 1 is a schematic representation of a fiber optic ring laser gyro, of the prior art, which utilizes a optical detector in conjunction with a fiber optic directional coupler.

Referring now to the drawings, and more particularly to FIG. 1, there is shown a fiber optic laser gyroscope, of the prior art, which shows fiber loop 17 together with fiber optic directional coupler 21 and detector 22.

Figure 2:
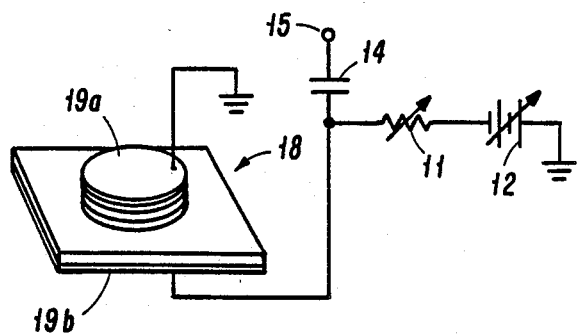
FIG. 2 is a schematic representation of a laser element, of the prior art, with only one non-ground electrode.

Now, referring to FIG. 2, there is shown a laser element of the prior art, which is capable of use in a fiber optic ring laser gyro. The laser element is shown with element 19-b, which is the only non-ground electrode for the element.

Figure 3:
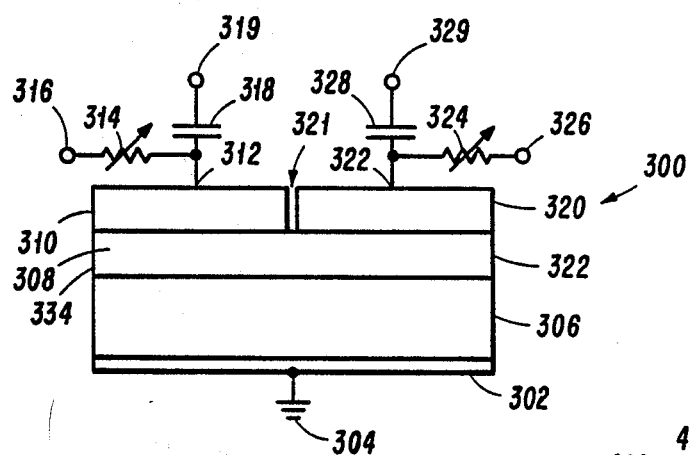
FIG. 3 is a schematic representation of a preferred embodiment of the optical amplifier diode of the present invention, which clearly shows the plurality of non-ground electrodes split across the optically active region of the diode.

Now referring to FIG. 3 there is shown a schematic cross-sectional view of an optical amplifier diode of the present invention, generally designated 300. Many different types of optical amplifier diodes are generally known in the industry, with the difference being largely a matter of design choice. The diode 300, of this invention, can be constructed from this description and known diode design and manufacturing techniques. Diode 300 is shown having a ground electrode 302 which is coupled with reference voltage 304. A diode body 306 is shown above the electrode 302, while the active region 308 having a first optical terminal 332 and a second optical terminal 334 is disposed above the body 306. A first non-ground electrode 320 is disposed above the active region 308. Coupled with electrode 320 is line 322. Variable resister 324 connects lead 326 with line 322. Capacitor 328 separates lead 329 from line 322. A second non-ground electrode is disposed above the active region 308, but is separated from the first non-ground electrode 320 by a very thin gap 321. Gap 321 is preferably wide enough so that electrodes 310 and 320 are truly electrically and spatially separate but as close together as practicable, with the spatial separation being measurable. Electrode 310 is connected through variable resister 314 to lead 316, and is separated from lead 319 by capacitor 318.

Figure 4:
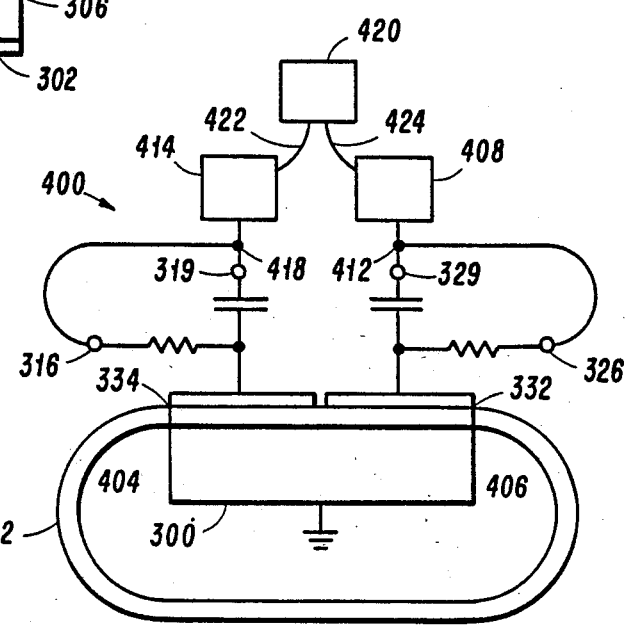
FIG. 4 is a schematic representation of a gyroscope of the present invention, which utilizes the diode of FIG. 3.

Now referring to FIG. 4, there is shown a gyro, generally designated 400, of the present invention. Gyro 400 includes diode 300 (FIGS. 3 & 4) together with optical fiber 402 which has a first fiber end 406 and a second fiber end 404, for optical coupling with optical terminals 332 and 334, respectively. Leads 326 and 329 are coupled with first electrode controller 408 which performs the function of controlling and monitoring the signals in and out of the first electrode 320. Leads 316 and 319 are coupled with second electrode controller 414, which is similar in function to controller 408. Phase detector and comparator 420 is coupled through lines 424 and 422 to controllers 408 and 414, respectively. Phase detector and comparator 420 detects and compares the phase information of the signals which originate from the electrodes.

In operation, the gyro is able to detect rotation of the optical fiber 402 by analyzing the changes in the electrical signals on leads 319 and 329, which reflect changes in the optical signals within the diode 300 and optical fiber 402. The output on either lead 319 or lead 329 can be used to determine the magnitude of any rotation, however the direction of rotation is determined by comparing the phase information from these leads which are spatially separated by a predetermined distance.

It is thought that the ring laser gyro of the present invention and many of its attendant advantages, will be understood from the forgoing description, an it will be apparent that various changes may be made in the form, construction, and the arrangement of the parts, without departing from the spirit and scope of the invention, or sacrificing all of their material advantages, the form described herein being merely preferred or exemplary embodiments thereof.

I claim:

1. A ring laser gyro comprising;
   a. an optical fiber, having a first fiber end and a second fiber end;
   b. an optical amplifier diode having a ground electrode and a plurality of nonground electrodes and further having a first optical terminal and a second optical terminal;
   c. said optical fiber being optically coupled at its first fiber end and its second fiber end to the first optical terminal and the second optical terminal, respectively, of said optical amplifier;
   d. means for controlling and monitoring the voltage upon said plurality of nonground electrodes; and
   e. means for comparing the voltages upon said plurality of nonground electrodes;

whereby, the direction and magnitude of rotation of the optical fiber can be determined by comparing the voltage output of the nonground electrodes, these voltages output will correspond to the beat frequency between the two counterpropagating beams within the optical fiber, and with a comparison of the phase differences in the outputs and the known dimension of separation between the nonground electrodes, the direction of rotation can also be determined.

2. A gyro of claim 1 wherein the plurality of nonground electrodes comprises two electrically and physically separate electrodes which are disposed at a predetermined and measurable distance from each other.

3. A gyro of claim 2 wherein the two nonground electrodes are disposed above the optically active channel of the diode.

4. A ring laser gyro of the type having an optical fiber which carries two counterpropagating light beams comprising;
   a. the optical fiber, having a first fiber end and a second fiber end;
   b. an optical amplifier diode having a ground electrode and a first nonground electrode and a second nonground electrode and further having a first optical terminal and a second optical terminal;
   c. said optical fiber being optically coupled at its first fiber end and its second fiber end to the first optical terminal and the second optical terminal, respectively, of said optical amplifier diode;
   d. means for controlling and monitoring the voltage upon said nonground electrodes; and
   e. means for comparing the voltages upon said nonground electrodes;
   f. said first nonground electrode and said second nonground electrode being electrically separate and spatially separated from each other by a predetermined distance;

whereby, the direction and magnitude of rotation of the optical fiber can be determined by comparing the voltage output of the nonground electrodes, these voltages output will correspond to the beat frequency between the two counterpropagating beams within the optical fiber, and with a comparison of the phase differences in the outputs and the known dimension of separation between the nonground electrodes, the direction of rotation can also be determined.

* * * * *